US005089739A

United States Patent [19]

Takahashi et al.

[11] Patent Number: 5,089,739

[45] Date of Patent: Feb. 18, 1992

[54] LAMINATE TYPE PIEZOELECTRIC ACTUATOR ELEMENT

[75] Inventors: Yoshikazu Takahashi, Kasugai; Masahiko Suzuki, Nagoya; Makoto Takeuchi, Okazaki, all of Japan

[73] Assignee: Brother Kogyo Kabushiki Kaisha, Aichi, Japan

[21] Appl. No.: 669,982

[22] Filed: Mar. 15, 1991

[30] Foreign Application Priority Data

| | | | |
|---|---|---|---|
| Mar. 19, 1990 | [JP] | Japan | 2-69504 |
| Aug. 28, 1990 | [JP] | Japan | 2-227635 |
| Sep. 26, 1990 | [JP] | Japan | 2-256083 |
| Oct. 31, 1990 | [JP] | Japan | 2-294582 |

[51] Int. Cl.⁵ .......... H01L 41/08
[52] U.S. Cl. .......... 310/328
[58] Field of Search .......... 310/328, 366

[56] References Cited

U.S. PATENT DOCUMENTS

| | | | |
|---|---|---|---|
| 4,633,120 | 12/1986 | Sato et al. | 310/328 |
| 4,721,447 | 1/1988 | Erckmann | 310/328 X |
| 4,932,119 | 6/1990 | Ealey et al. | 310/328 X |
| 4,978,881 | 12/1990 | Wakita et al. | 310/328 |

FOREIGN PATENT DOCUMENTS

| | | | |
|---|---|---|---|
| 0229380 | 11/1985 | Japan | 310/366 |
| 0206281 | 9/1986 | Japan | 310/366 |

*Primary Examiner*—Mark O. Budd
*Attorney, Agent, or Firm*—Oliff & Berridge

[57] ABSTRACT

A laminate piezoelectric actuator element comprising plural laminated piezoelectric subunits each of which comprises piezoelectric ceramic layers for generating longitudinal electrostrictive strain with a voltage, internal electrodes for applying the voltage to said piezoelectric ceramic layers, and piezoelectrically-inactive portions which correspond to parts of the piezoelectric ceramic layers having no internal electrodes laminated thereon. The piezoelectric ceramic layers and the internal electrodes are alternatively laminated on each other to form a piezoelectric subunit. An adhesive member having an attaching area equal to or smaller than an area of each internal electrode is provided between the neighboring piezoelectric subunits to thereby attach and assemble the plural piezoelectric subunits to form the piezoelectric actuator element and form slit portions between the laminated piezoelectric subunits in such a manner as to surround the adhesive member. The piezoelectric actuator element further includes external electrodes provided at both sides thereof in such a manner as to be connected to the internal electrodes to apply the voltage to the internal electrodes.

7 Claims, 4 Drawing Sheets

LAMINATE TYPE PIEZOELECTRIC ACTUATOR ELEMENT

BACKGROUND OF THE INVENTION

This invention relates to a piezoelectric actuator element, and more particularly to a laminate type piezoelectric actuator element used in a piezoelectric actuator for a printer or the like.

There has been conventionally known a laminate type of piezoelectric actuator element in which plural piezoelectric ceramic layers of lead zirconate titanate (PZT) group and internal electrode layers are alternately laminated in a longitudinal (laminating or expanding and contracting) direction, and positionally displaced due to a piezoelectric and electrostrictive longitudinal effect thereof when a voltage is applied to the internal electrode layers. Such a laminate piezoelectric actuator element, which is called a longitudinal effect type of laminate piezoelectric actuator element, is expanded and contracted in the longitudinal or laminating direction thereof in accordance with polarity of the applied voltage to the internal electrode layers, and thus this displacing motion of the element has been utilized in an actuator for a piezoelectric dot impact printer head or a VTR head, or an oscillator for an ultrasonic motor or the like.

Each piezoelectric ceramic layer of this type of piezoelectric actuator element generally has a thickness of approximately 100 microns, however, in accordance with requirement for diversification of the laminate piezoelectric actuator element, a laminate piezoelectric actuator element which has thinner piezoelectric ceramic layers of approximately several tens of microns in thickness has been recently proposed.

In general, insulation assurance between the internal electrode layers is decreased and migration more frequently occurs between the electrode layers when the thickness of each of the piezoelectric ceramic layer is decreased below several tens of microns in thickness. In order to prevent deterioration of the insulation and improve a moisture-resistant property of the piezoelectric actuator element, the laminate piezoelectric element has been provided with an internal electrode structure in which so-called piezoelectrically-inactive portion having no internal electrode layer is formed at the peripheral portion of each piezoelectric ceramic layer.

In order to perform a driving operation with a low voltage in such a laminate piezoelectric actuator element, it is required that each of the piezoelectric ceramic layers should be thinner in thickness and the number of laminating layers thereof increased. However, as each of the piezoelectric ceramic layers is thinner in thickness and the number of laminating layers thereof is increased, it frequently occurs that a degreasing member used in a degreasing process is damaged, and inhomogeneity of each piezoelectric ceramic layer occurs in a sintering process, so that reliability of the piezoelectric actuator element is decreased.

Further, in the laminate piezoelectric actuator element having the piezoelectrically-inactive portion, the piezoelectrically-inactive portion has a restrictive action on the displacing motion of the piezoelectric actuator element when a voltage is supplied, that is, the displacing motion of the piezoelectric actuator element is disturbed by a clamping action of the piezoelectrically-inactive portion, and thus there occurs a problem that displacement loss, inhomogeneous displacement distribution, and internal stress occur in the piezoelectric actuator element.

SUMMARY OF THE INVENTION

An object of this invention is to provide a highly reliable, mechanically and thermally strong laminate piezoelectric actuator element having a piezoelectrically-inactive portion which is operable with a low driving voltage, and capable of preventing displacement loss, inhomegeneous displacing distribution and internal stress due to the piezoelectrically-inactive portion.

In order to attain the above object, a laminate piezoelectric actuator element according to this invention in which a longitudinal electrostrictive strain is obtained through a piezoelectric/electrostrictive longitudinal effect with a voltage, comprises plural laminated piezoelectric subunits each comprising piezoelectric ceramic layers for generating the longitudinal electrostrictive strain therethrough with an applied voltage thereto, internal electrode layers each comprising an internal electrode and a drawing electrode for applying the voltage to the piezoelectric ceramic layers, and piezoelectrically-inactive portions for generating no longitudinal electrostrictive strain, the piezoelectric ceramic layers and the internal electrode layers being alternatingly laminated on each other, and the internal electrodes having an area smaller than an area of the piezoelectric ceramic layers to define the piezoelectrically-inactive portions as parts of the piezoelectric ceramic layer having no internal electrodes laminated thereon, an adhesive member for attaching the laminated piezoelectric subunits to one another other therethrough, an attaching area of the adhesive member being equal to or smaller than an area of the internal electrodes to thereby form slit portions between the laminated piezoelectric subunits in such a manner as to surround the adhesive member, wherein the plural piezoelectric element subunits are laminated through the adhesive member in a laminating direction thereof, and external electrodes provided at both sides of the piezoelectric subunits in such a manner as to be connected to the internal electrode through the drawing electrode to apply the voltage to the internal electrode.

The slit portions may be filled with filler such as thermosetting resin of epoxy group to preventing deterioration in mechanical strength of the piezoelectric actuator element due to the presence of the slit portions.

According to the laminate piezoelectric actuator element thus constructed, the piezoelectric subunits each having the piezoelectrically-inactive portion at the peripheral portion of the piezoelectric ceramic layer are laminated through the adhesive member having an attaching area equal to or smaller than the area of the internal electrode in the laminating or longitudinal direction, and the piezoelectric actuator element performs its displacing motion with a desired driving voltage without disturbance of the displacing motion of the piezoelectric actuator element by the piezoelectrically-inactive portions.

DETAILED DESCRIPTION OF THE INVENTION

Preferred embodiments of this invention will be described with reference to the accompanying drawings.

Figure 1:
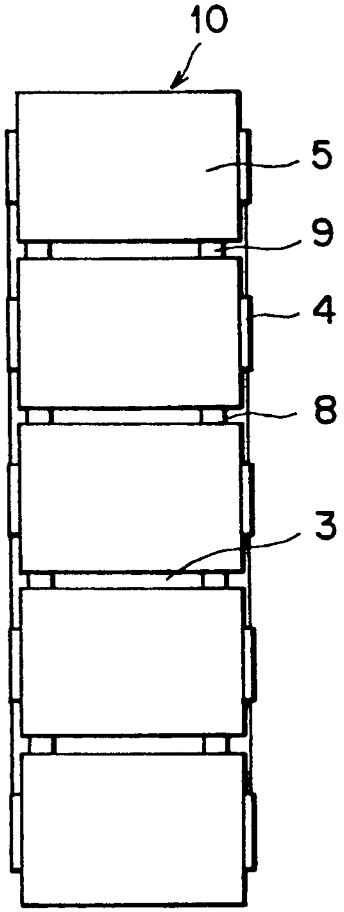
FIG. 1 shows a first embodiment of a piezoelectric actuator element having plural piezoelectric subunits.

FIG. 1 shows a first embodiment of a type laminate piezoelectric actuator element according to this invention. The piezoelectric actuator element 10 of this embodiment has a laminate structure, and comprises plural longitudinal effect type of laminate piezoelectric actuator element subunits 5 (hereinafter referred to as "piezoelectric subunit") which are laminated in a tandem form, adhesive members 3 each for attaching neighboring piezoelectric subunits 5 therethrough, external electrodes 4 each for supplying a driving voltage to the piezoelectric subunit 5 and external electrode connecting members 8 for electrically connecting the external electrodes 4 to one another.

Figure 2:
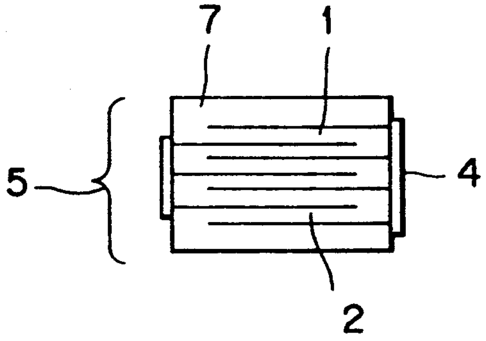
FIG. 2 is a schematic diagram for showing each of the piezoelectric subunits of the piezoelectric actuator element as shown in FIG. 1.

FIG. 2 is a cross-sectional view of each of the piezoelectric subunits 5 as shown in FIG. 1. Each piezoelectric subunit 5 includes plural substantially-square piezoelectric ceramic layers 1 each of which is formed of lead zirconate titanate (PZT) group (e.g. including components of $(Pb,La)(Ti,Zr)O_3$ and $Pb(Mg_{1/2}W_{1/2})O_3$) and has a 20 microns thickness and a 3.0 mm×3.0 mm area, and plural substantially-square internal electrode layers 2 having a smaller area than that of each piezoelectric ceramic layer, for example, a 2.5×2.5 mm area and formed of Ag-Pd group. The piezoelectric ceramic layers 1 and the internal electrode layers 2 are alternately laminated to form the piezoelectric subunit 5.

Figure 3A:
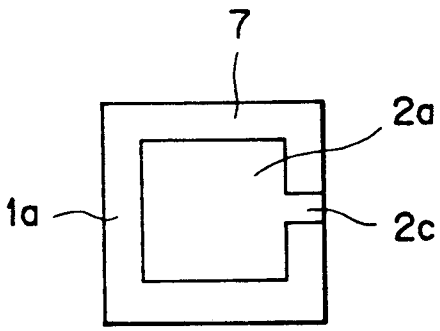
FIGS. 3(A) and 3(B) show cross-sectional views of alternately-laminated piezoelectric layers constituting the piezoelectric subunit as shown in FIG. 2.
Figure 3B:
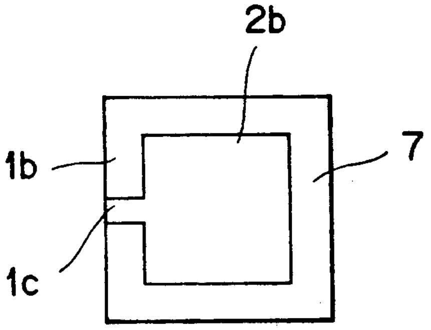

As shown in FIGS. 3(A) and 3(B), the internal electrode layer 2 comprises an internal electrode 2*a* (2*b*) and a drawing electrode 2*c* (1*c*) for electrically connecting the internal electrode 2*a* (2*b*) to the external electrodes 4. The internal electrode layer 2 is formed on the piezoelectric ceramic layer 1 by a screen printing process to form a piezoelectric layer having a piezoelectric ceramic layer 1, an internal electrode 2*a* (2*b*), a drawing electrode 2*c* (1*c*) and a piezoelectrically-inactive portion 7 as shown in FIGS, 3(A) and 3(B). The piezoelectrically-inactive portion 7 comprises a part of the piezoelectric ceramic layer 1 (e.g. having a 0.25 mm width), which is not covered (laminated) by the internal electrode layer 2 and is provided so as to surround the internal electrode 2*a* (2*b*) and which is not applied with a driving voltage, and thus does not contribute to a displacing motion of the piezoelectric actuator element even when a voltage is applied to the internal electrode 2*a* (2*b*).

A plurality (e.g. several to several tens) of piezoelectric layers thus formed are further laminated in such a manner that the piezoelectric ceramic layers 1 and the internal electrode layers 2 are alternately laminated on one another, thereby forming a piezoelectric subunit 5. In this case, the two groups of internal electrode layers as shown in FIG. 3(A) and FIG. 3(B) whose drawing electrodes 2*c* and 1*c* are extended in opposite directions to each other, are alternately arranged in a longitudinal (laminating) direction. Further, at each of the top and bottom surfaces of the piezoelectric subunit 5 in the longitudinal direction may be formed a piezoelectric ceramic layer having 40 microns thickness which does not contribute to the displacing motion.

The piezoelectric subunit 5 thus formed is sintered into one body at a sintering temperature of 1050° C. The external electrodes 4 are formed at both sides of the subunit 5, and the drawing electrodes 2*c* and 1*c* of the laminated internal electrode layers 2 are connected to the external electrodes 4 located at the opposite sides of the subunit 5, respectively, and the alternative laminated external electrodes 2 are charged at positive and negative polarities, respectively (for example, when the external electrode 4 at one side of the subunit 5 is applied with a positive voltage, while the external electrode 4 at the other side of the subunit 5 is applied with a negative voltage, and vice versa). The internal electrodes 2*a* and 2*b* are subjected to a polarization process with a direct current electric field through the external electrodes 4 so that the neighboring piezoelectric ceramic layers 1*a* and 1*b* are polarized in the opposite directions to each other along the longitudinal (laminating) direction.

Figure 4:
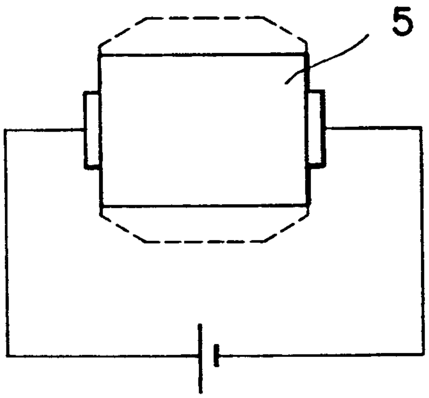
FIG. 4 shows a displacing motion of the piezoelectric subunit when a voltage is applied.

When applied with a voltage having the same polarity as used in the polarization process, the piezoelectric subunit 5 is deformed or displaced through piezoelectric/electrostrictive longitudinal effect as shown in FIG. 4. In this case, the piezoelectrically-inactive portions 7 which are not applied with the voltage, are not deformed (displaced) irrespective of the deformation (displacement) of the other parts of the piezoelectric ceramic layers 1 which are laminated by the internal electrodes 2*a* (2*c*), and thus the deformation (displacement) of the piezoelectric subunit 5 is prevented by the piezoelectrically-inactive portions 7, that is, a restrictive force of disturbing a displacing motion of the subunit 5 occurs through the piezoelectrically-inactive portions 7, so that inhomegeneous displacement distribution, displacement loss and inner stress occur within the piezoelectric subunit 5. If plural subunits are directly contacted through the whole surfaces (3.0 mm×3.0 mm in area) thereof and laminated on one another in the longitudinal (displacement occurring) direction to produce a piezoelectric actuator element, it would be found that the restrictive force of the piezoelectrically-inactive portions 7 is increased and a large amount of the displacement loss and a great internal stress occur. In order to avoid the above disadvantage, the adhesive member 3 may be provided between the neighboring piezoelectric subunits to attach or couple the neighboring piezoelectric subunits 5 to each other. Organic adhesive such as thermosetting organic adhesive, engineering plastic, for example, polyphenylene sulfide (PPS), or soldering agent such as Ag or the like may be used as the adhesive member 3.

As shown in FIG. 1, the adhesive member 3 are provided between the neighboring piezoelectric subunits 5 in such a manner that the area of the adhesive member 3 is equal to or smaller than the area of the internal electrodes 2*a* (2*b*). Accordingly, a space portion (hereinafter referred to as "slit portion") 9 is formed between the neighboring piezoelectric subunits 5 in such a manner as to surround each adhesive member 3. The internal stress occurring in a driving operation of the piezoelectric actuator element is mitigated (absorbed) through the slit portion 9, so that a mechanical damage of the whole piezoelectric actuator element is prevented.

As described above, plural piezoelectric subunits 5 as shown in FIG. 2 are laminated on one another through the square adhesive members 3 of organic adhesive (e.g. having an area below 2.5×2.5 mm area for the internal electrode having an area of 2.5×2.5 mm), thereby producing a laminate piezoelectric actuator element 10 in which the slit portions 9 of above 0.25 mm width are formed at the peripheral portion of the adhesive member 3, that is, so as to surround the adhesive member 3.

As described above, each piezoelectric ceramic layer 2 is designed to be very thin (e.g. a thickness of 20 microns) and a laminating number of the piezoelectric layers is in the range of several microns to several tens microns, so that it is easy to perform a sintering control to the thickness of the layer, and homogeneity and minuteness of grain diameter, and reliability to piezoelectricity and insulation of the piezoelectric actuator element are assured. Further, the number of piezoelectric subunits to be laminated, each subunit having a thin piezoelectric ceramic layer of several microns to several tens microns in thickness, is arbitrarily determined, so that a piezoelectric subunit having high reliability is obtained. Therefore, reliability to the laminate piezoelectric actuator element comprising the piezoelectric subunits can be wholly improved.

Further, since the piezoelectric subunit has piezoelectrically-inactive portions at the peripheral portions of the internal electrode layers, insulation between internal electrode layers formed at both sides of the piezoelectric actuator element is improved in reliability, and moisture-resistant property therebetween is sufficient.

In an experiment for measuring a displacing motion and a tensile strength, the longitudinal effect type of laminate piezoelectric actuator element 10 (having internal electrode of 2.5 mm×2.5 mm in area, adhesive member of 2.5 mm×2.5 mm in area, and slit portion of 0.25 mm width) of this embodiment performed a 7-micron displacement by applying a driving voltages of 60 volts to the external electrode 4 thereof. As another example, plural (e.g. 10) piezoelectric subunits 5 were attached through the adhesive members 3 each having 2.0×2.0 mm area, and then a slit portion 9 having 0.5 mm width were formed at the peripheral portion of each adhesive member 3 to form a laminate piezoelectric actuator element 10. The laminate piezoelectric actuator element 10 thus constructed performed a 8-micron displacement by applying 60 volts to the external electrode 4.

In comparison, two laminate piezoelectric actuator elements were formed, one in which ten piezoelectric element subunits 5 were directly laminated on and attached to one another, and the other in which ten piezoelectric subunits 5 were laminated on and attached to one another through adhesive members each having 2.7×2.7 mm area and then a slit portion 9 having a 0.15 mm width was formed at the peripheral portion of each of the adhesive member 3. These laminate piezoelectric actuator elements performed 4.8-micron displacement and 5-micron displacement, respectively, by applying 60 volts to the external electrode 4.

As is apparent from the above experiment, when the area of the adhesive member 3 is equal to or smaller than the area of the internal electrode 2*a* (2*c*), it is found that the slit portions 9 prevent the piezoelectrically-inactive portions from restricting the displacing motion of the longitudinal effect type of piezoelectric actuator element 10. Further, an internal stress occurring in a driving operation can be depressed and a mechanical damage of the element due to the piezoelectrically-inactive portions 7 can be prevented by the slit portions 9.

In the above embodiment, various types of adhesive members such as organic adhesive, engineering plastic and soldering agent may be used to perform an attaching process between the piezoelectric subunits. However, such adhesive members bring the following disadvantages to the piezoelectric actuator element.

In a case of the thermosetting organic adhesive, it is difficult to accurately adjust an attaching area in which the adhesive is partially coated in an attaching process, and there occur deterioration of adhesiveness of the adhesive or damage of the adhesive due to increase of temperature by heat, which is caused by dielectric loss of the piezoelectric ceramic layers when the piezoelectric actuator element is driven.

In a case of the engineering plastic, it is easy to perform the accurate adjustment of the attaching area by using a sheet of engineering plastic whose shape is freely variable. However, many types of engineering plastic, like PPS, has insufficient adhesiveness to the piezoelectric subunit although they have large strength and thermal stability, and thus destruction is liable to occur at the boundary between the adhesive member and the piezoelectric subunit.

In a case of the soldering agent, an excellent attaching in mechanical strength would be made between the soldering agent and other elements, however, the soldering agent has a conductivity unlike the organic adhesive and the glass, and thus a specific process is required to assure insulation between the soldering agent and the external electrodes in a process of connecting the external electrodes of the laminated piezoelectric subunits. This process makes a whole process complicated and causes the total cost of the piezoelectric actuator element to be high.

In addition, the above adhesive materials require a heating process of heating the materials at a high temperature to cure them. During the heat process, the piezoelectric ceramic layers and the internal electrodes are also heated, so that electrical and physical characteristics of the piezoelectric ceramic layers and the internal electrodes are deteriorated.

In order to overcome the above disadvantage, there may be used low-melting glass (e.g. glass having a melting point below 700° C., and preferably below 500° C.), preferably lead low-melting glass having a thickness below 15 microns, or a piezoelectric ceramic material having similar components to those of a piezoelectric ceramic material of the piezoelectric subunit 5 and lower sintering temperature than that of the piezoelectric ceramic material of the piezoelectric subunit 5.

A piezoelectric actuator element using the low-melting glass as adhesive member will be first described.

If components of the glass adhesive member are selected in consideration of thermal diffusion between the glass and the piezoelectric subunit and such that the thermal expansion coefficient of the glass is coincident with that of the piezoelectric ceramic layers, an excellent thermal-diffusive attaching operation is carried out without leaving residual strain, and the piezoelectric actuator element having a strong attaching surfaces can be obtained. Further, even when dielectric loss occurs in the piezoelectric subunit and temperature is increased due to heat of the dielectric loss in a driving operation of the piezoelectric actuator element, the glass serving as the adhesive member is not deteriorated even by the temperature increase because it has a sufficiently high softening point, and stress which would be caused by a difference in thermal expansion coefficient between the glass and the piezoelectric subunit is very slight. As a result, the piezoelectric actuator element has excellent mechanical and thermal properties.

The low-melting glass has advantages that a screen printing method is used by pasting the glass with glass frit, and thus the adjustment of the attaching area is accurately made, and that a layer thickness can be controlled to some extent by managing a load in a heat treating process. However, the glass itself is very fragile and delicate, and thus there is a possibility that the glass itself is broken by an expanding stress in a driving operation of the piezoelectric actuator element when the glass adhesive member has an ordinary thickness (several tens microns). However, if the thickness of the glass adhesive member is formed of lead group low-melting glass having a thickness below 15 microns, the disadvantageous properties of the glass such as fragility and delicateness are overcome.

An attaching process of attaching the piezoelectric subunits through the low-melting glass will be described hereunder.

Lead low-melting glass frit (softening point of 530° C.) is mixed with organic coupling agent and solvent in a planetary ball mill to be in a pasted form. The pasted glass is printed on a piezoelectric subunit 5 by a screen printing method in such a manner that the pasted material having a 10-micron thickness is located concentrically with the internal electrode *2a* (*2c*) and within an area (e.g. 1.7×1.7 mm) which is equal to or smaller than that (e.g. 2.2 mm×2.2 mm) of the internal electrode *2a* (*2b*) after a heat-treating process. In this case, it is noted that the printed glass is not overlapped with the piezoelectrically-inactive portion. Plural (e.g. five) piezoelectric subunits, each of which is printed with the pasted low-melting glass, are laminated through the pasted glass in the laminating direction (a direction of the displacing motion due to longitudinal effect) in a magnesia and alumina ceramic pressure unit for heat treatment, and then subjected to a heat treatment at 560° to 580° C. in atmosphere for purpose of coupling of the elements. In this case, the thickness of the glass adhesive member 3 is about 6 microns, and the attaching area is about 2.2 mm×2.2 mm.

Since the temperature for the above heat treatment is in the range of 560° to 580° C., and is sufficiently lower than the sintering temperature of the piezoelectric subunit. Therefore, the piezoelectric ceramic layers and the internal electrodes are not deteriorated by the heat treatment.

The external electrodes 4 of the piezoelectric actuator element 10 thus obtained are connected through the external electrode connecting members 8 to one another. In this case, insulation between the external electrodes located at both sides of the piezoelectric actuator element (positive and negative external electrodes) is completely assured because the low-melting glass is used as the adhesive member, so that the positive (negative) external electrodes between the neighboring piezoelectric subunits are connected to one another without a special treatment such as an insulating treatment. After subjected to the polarization treatment, the piezoelectric actuator element thus obtained was supplied with a pulse DC voltage of 60 volts, and its displacing motion was measured by a laser displacement measuring unit. A displacement about 11.5 microns was measured.

Each of the five laminated piezoelectric subunits has a displacement of approximately 2.2 to 2.4 microns for a driving voltage of 60 volts, and thus a displacement loss due to lamination of the piezoelectric subunits was very slight. Further, deterioration of the piezoelectric characteristic of the piezoelectric ceramic layer due to the heat treatment for the coupling of the piezoelectric subunits through the glass adhesive member was not found.

A measured value of tensile strength of each piezoelectric subunit 5 was in the range of 9 kgf to 20 kgf (average value of 13 kgf). On the other hand, the piezoelectric actuator element comprising the piezoelectric subunits which had been laminated through the low-melting glass adhesive member, provided a measured value of 11 kgf to 26 kgf in tensile strength. For a destruction test, the destruction was not found at an attaching or coupling boundary between the glass adhesive member and the piezoelectric subunits and within the glass adhesive member, but it was found within the piezoelectric subunits 5.

As is apparent from the destruction test, the strength at the attaching or coupling boundary is substantially equal to that of the piezoelectric subunit, and thus a specifically weak portion does not exist in the piezoelectric actuator element of this embodiment, and has substantially the same strength as a conventional integrally-sintered piezoelectric actuator element using no adhesive member. Accordingly, the piezoelectric actuator element of this embodiment may be applied to any field which has been conventionally applied.

In comparison, two groups of piezoelectric actuator elements having the same structure as described above, but having different thicknesses (e.g. 15 microns and 20 microns) were formed, and then the tensile strengths thereof were measured to be a range of 4 kgf to 12 kgf for the former, and 3 kgf to 4 kgf for the latter. For the former, a half of the samples were destroyed in the glass adhesive member 3, while the other were destroyed in the piezoelectric subunits 5. On the other hand, for the latter, all of the samples were destroyed in the glass adhesive member 3.

A piezoelectric actuator element using the piezoelectric ceramic material as adhesive member will be described hereunder.

First, preparation of the piezoelectric ceramic material serving as the adhesive member and an attaching operation of the neighboring piezoelectric subunits through the adhesive member will be next described hereunder.

Pre-sintered powder of piezoelectric ceramic material which includes lead (Pb), lanthanum (La), titanium (Ti), zirconium (Zr), magnesium (Mg), and tungsten (W) in different composition ratio is finely pulverized to produce particles having average diameter of 0.05 micron, and then the fine particles thus obtained are mixed with organic coupling agent and solvent in a planetary ball mill to obtain the pasted material (piezoelectric ceramic material). The pasted material is printed on a piezoelectric subunit 5 by a screen printing method in such a manner that the pasted material having a 10-micron thickness is located concentrically with the internal electrode 2*a* (2*c*) and within an area which is equal to or smaller than that of the internal electrode 2*a* (2*b*). Plural (e.g. five) piezoelectric subunits, each of which is coated with the pasted piezoelectric ceramic material, are laminated through the pasted piezoelectric ceramic material in the laminating direction (a direction of the displacing motion due to longitudinal effect) in a magnesia and alumina ceramic pressure unit for heat treatment, and then subjected to a heat treatment at 950° C. in atmosphere for purpose of attaching or coupling of the elements.

The piezoelectric ceramic material as described above is sufficiently closely aggregated at temperature of 900° C. and has high density. In the laminated piezoelectric subunits thus heat-treated at an attaching or coupling temperature of 950° C., mutual thermal diffusion occurs among the components of lead (Pb), lanthanum (La), titanium (Ti), zirconium (Zr), magnesium (Mg), and tungsten (W) due to difference in concentration, and a thermal diffusion layer is formed at the boundaries between the piezoelectric ceramic adhesive member and each piezoelectric subunit. The thickness of the thermal diffusion layer is in the range of approximately 15 to 25 microns. On the other hand, the piezoelectric ceramic layer 1 of the piezoelectric subunit 5, which is contacted with the piezoelectric ceramic adhesive member 3, has a thickness of 40 microns, and thus a piezoelectric characteristic of the piezoelectric ceramic layer 1 is not damaged by the thermal diffusion of the components of the adhesive member 3 into the piezoelectric ceramic layer 1. Further, since the coupling temperature of the 950° C. for the heat treatment is lower than the sintering temperature (1050° C.) of the piezoelectric subunits 5 by 100° C., granulation of the piezoelectric ceramic layers 1 and deterioration of the internal electrode layers 2 due to the thermal diffusion never occur.

The external electrodes 4 of the piezoelectric actuator element 10 thus obtained are connected through the external electrode connecting members 8 to one another. In this case, insulation between the external electrodes located at both sides of the piezoelectric actuator element (positive and negative external electrodes) is completely assured because the piezoelectric ceramic material is used as the adhesive member, so that the positive (negative) external electrodes between the neighboring piezoelectric subunits are connected to one another without a special treatment. After subjected to the polarization treatment, the piezoelectric actuator element thus obtained was supplied with a voltage of 60 volts, and its displacing motion was measured by a laser displacement measuring unit. A displacement about 11.5 microns was measured.

Each of the five laminated piezoelectric subunits has a displacement of approximately 2.2 to 2.4 microns for a driving voltage of 60 volts, and thus a displacement loss due to lamination of the piezoelectric subunits was very slight. Further, deterioration of the piezoelectric characteristic of the piezoelectric ceramic layer due to the coupling process was not found.

A measured value of tensile strength of each piezoelectric subunit 5 was in the range of 9 kgf to 20 kgf (average value of 13 kgf). On the other hand, the piezoelectric actuator element comprising the piezoelectric subunits which had been laminated through the piezoelectric ceramic adhesive member, provided a measured value of 8 kgf to 15 kgf in tensile strength. For a destruction test, it was not necessarily found that destruction occurred at an attaching or coupling boundary between the piezoelectric ceramic adhesive member and the other elements and within the piezoelectric ceramic adhesive member, but it was found that the destruction occurred within the piezoelectric subunits 5. As is apparent from the destruction test, the strength at the attaching or coupling boundary is substantially equal to that of the piezoelectric subunit, and thus a specifically weak portion does not exist in the piezoelectric actuator element of this embodiment, and has substantially the same strength as a conventional integrally-sintered piezoelectric actuator element using no adhesive member. Accordingly, the piezoelectric actuator element of this embodiment may be applied to any field which has been conventionally applied.

As described above, the piezoelectrically-inactive portions cause the displacement loss, the inhomegeneous displacement distribution and the internal stress through the clamping action thereof, and in order to depress the clamping action of the piezoelectrically-inactive portions, the slit portions 9 are provided at the peripheral portions of the adhesive members 3. However, when an external force is applied to a piezoelectric actuator element having the slit portions 9, destruction is liable to occur in the neighborhood of the slit portions 9 because each of the slit portions 9 is a space. Therefore, the whole strength of the piezoelectric actuator element is lowered due to existence of the spatial slit portions 9.

In order to overcome the above disadvantage, the slit portions 9 may be filled with a filler having a smaller Young's modulus than that of the piezoelectric ceramic material constituting the piezoelectric ceramic layers 1. The filling of such a filler into the slit portions 9 prevents deterioration of the whole mechanical strength of the piezoelectric actuator element with maintaining an effect of depressing the clamping action of the piezoelectrically-inactive portions by the slit portions 9. As the filler may be used, for example, thermosetting resin of epoxy group.

Figure 5:
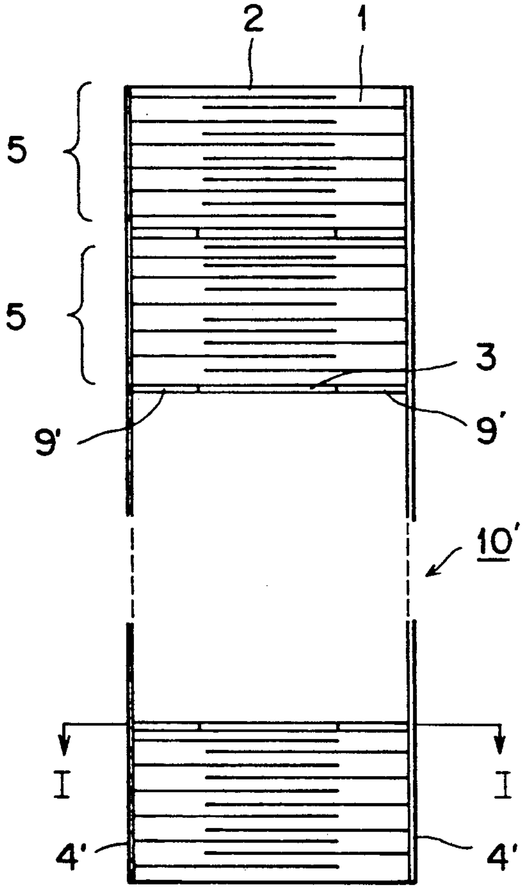
FIG. 5 shows a second embodiment of the piezoelectric actuator element using a filler.
Figure 6:
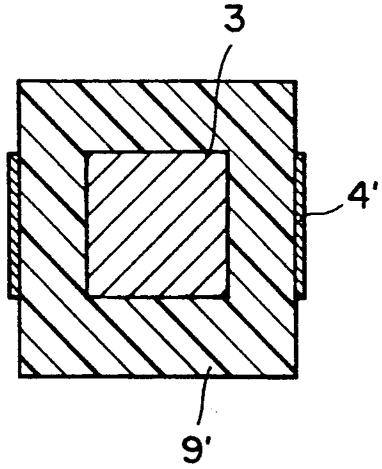
FIG. 6 is a cross-sectional view of the piezoelectric actuator element as shown in FIG. 5, which is taken along the line I—I.

FIG. 5 shows a second embodiment of the piezoelectric actuator element utilizing the thermosetting resin of epoxy group as the filler, and FIG. 6 is a cross-sectional view of the piezoelectric actuator element as shown in FIG. 5 which is taken along a line I—I. The same elements as those of the first embodiment as shown in FIG. 1 are represented by the same reference numerals.

The piezoelectric actuator element 10' of this embodiment comprises plural (e.g. 10) laminated piezoelectric subunits 5 each having a 3 mm×3 mm area and a 0.5 mm thickness. Each of the piezoelectric subunits 5 comprises plural (e.g. 23) piezoelectric ceramic layers 1 each having an area of 3.0 mm×3.0 mm and a thickness of 20 microns and internal electrode layers 2 each comprising an internal electrode 2*a* (2*b*) having an area of 2.5 mm×2.5 mm and a thickness of 2 microns, the piezoelectric ceramic layers 1 and the internal electrode layers 2 being alternately laminated on one another in the same manner as that of the first embodiment. In this embodiment, the external electrodes and the external electrode connecting members are integrally formed as external electrodes 4', but they may be formed separately from each other as the external electrodes and the external electrode connecting members like the first embodiment. The internal electrodes 2a (2c) of this embodiment are also connected to the external electrodes 4 through the internal electrode drawing portions (drawing electrodes) 2c (1c).

As shown in FIG. 6, in this embodiment, the neighboring piezoelectric subunits 5 are attached through the adhesive member 3 such as the thermosetting organic adhesive, the glass having a low melting point, the soldering agent, or the piezoelectric ceramic material as described above. The adhesive member 3 has an area equal to or smaller than that of each internal electrode 2a (2c), for example, a 2.5 mm×2.5 mm area and a 10-micron thickness, and the thermosetting resin of epoxy group is filled as a filler 9' into the slit portions 9 in such a manner as to surround the adhesive member 3.

When the piezoelectric actuator element 10' (first element) thus constructed was applied with 60 volts, a displacement of 6.3 microns was obtained. On the other hand, a piezoelectric actuator element (second element) having no filler 9' provided a displacement of 7.0 microns, and a piezoelectric actuator element (third element) having no filler and no adhesive member (the subunits were wholly and directly attached to each other) provided a displacement of 4.8 microns. Further, the tensile strength was measured to be 4.0 kgf, 3.2 kgf and 4.6 kgf for the first, second and third elements, respectively.

Figure 7:
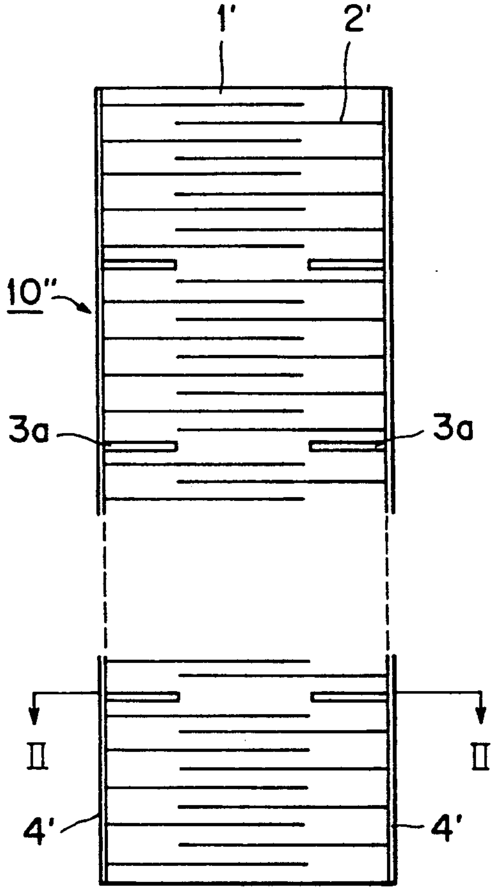
FIG. 7 shows a third embodiment of the piezoelectric actuator element in which the piezoelectric ceramic layers and the internal electrode layers are directly and integrally laminated.

Of course, the above technique can be applied to a piezoelectric actuator element which is produced by integrally laminating all of piezoelectric ceramic layers and internal electrode layers without laminating subunits. FIG. 7 shows a third embodiment of the piezoelectric actuator element utilizing the filler as described above, in which all of the piezoelectric ceramic layers and the internal electrode layers 2 are integrally formed to form the piezoelectric actuator element. That is, the piezoelectric actuator element of this embodiment is produced not by laminating individually-formed plural piezoelectric subunits and then assembling them with the adhesive member, but by integrally laminating piezoelectric ceramic layers and internal electrode layers to directly form the piezoelectric actuator element.

Figure 8:
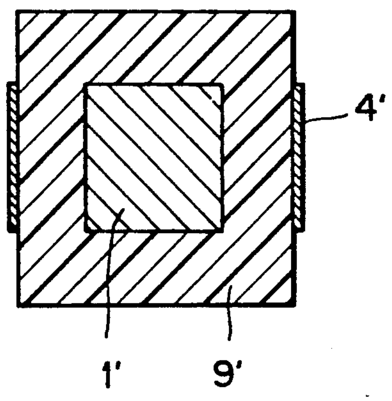
FIG. 8 is a cross-sectional view of the piezoelectric actuator element as shown in FIG. 7, which is taken along the line II—II.

The piezoelectric actuator element 10'' of this embodiment has an integration type of laminate structure in which piezoelectric ceramic layers 1' each having a thickness of approximately 30 microns and internal electrode layers each having 3 microns are alternately laminated on each other, and includes slit portions 3a formed at a predetermined distance (every nine piezoelectric layers each of which comprises a piezoelectric ceramic layer and an internal electrode layer) in a laminating direction in such a manner as to surround the piezoelectric ceramic layers as shown in FIG. 8. In this embodiment, the laminated internal electrode layers 2' are connected alternately to two groups of external electrodes (positive and negative external electrodes) 4' located at both sides of the piezoelectric actuator element 10''. That is, the odd-numbered internal electrode layers are connected to the (e.g. positive) external electrode 4' located at the left side of the piezoelectric actuator element 10'' while the even-numbered internal electrode layers are connected to the (e.g. negative) external electrode 4' located at the right side of the piezoelectric actuator element 10''.

Each of the slit portions 3a is formed in the piezoelectric actuator element 10'' in such a manner that an inner boundary (periphery) of each slit portion 3a has the same shape as the square internal electrode and the boundaries of the slit portion 3a and the internal electrode are overlapped with each other. Further, the filler 9' formed of thermosetting resin of epoxy group is filled in the slit portions 3a as shown in FIG. 8.

In an experiment for the displacement measurement and the tensile strength, a piezoelectric actuator element 10'' (first element) having a apparent dimension of 6 mm×6 mm×10 mm was used, in which the internal electrode has an area of 5.5 mm×5.5 mm, and the piezoelectrically-inactive portions and the slit portions had approximately 0.25 micron width and 10-micron thickness. In comparison, a piezoelectric actuator element (second element) having the same structure and no filler 9' and a piezoelectric actuator element (third element) having the same structure and no slit portion were also measured. When the first to third piezoelectric actuator elements were applied with 35 volts through the external electrodes, displacements of 5.8 microns, 6.9 microns and 4 microns were measured for the first, second and third elements, respectively. Further, the tensile strengths of 13.6 kgf, 12.1 kgf and 14.4 kgf were measured for the first, second and third elements.

As is apparent from the above experiments, even though the piezoelectric actuator element having the filler 9' is slightly inferior in displacement value to the piezoelectric actuator element having no filler 9', it is superior over the conventional piezoelectric actuator element having no slit portion. Further, the piezoelectric actuator element having the filler is superior in tensile strength over the piezoelectric actuator element having no filler.

Figure 9:
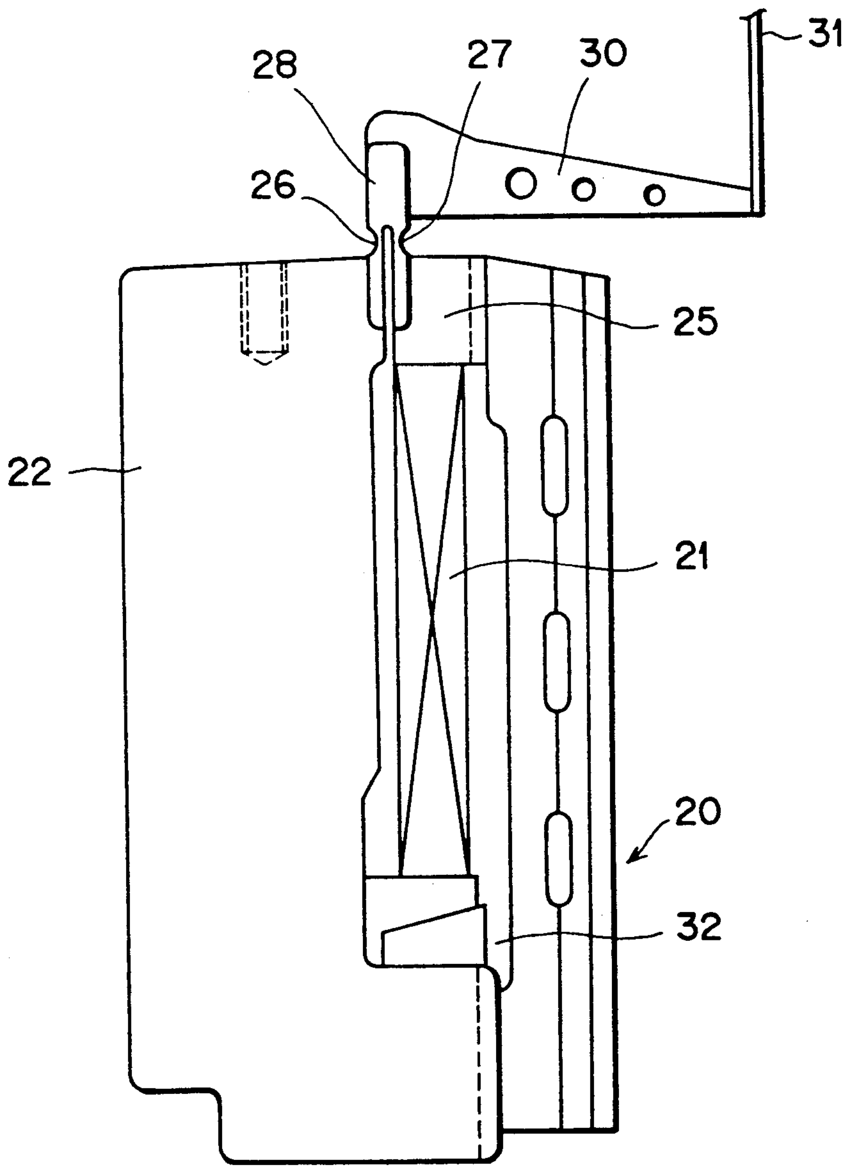
FIG. 9 shows an embodiment of a driving unit for driving a printing wire of a printer, in which the piezoelectric actuator element of this invention is used.

FIG. 9 shows an embodiment of a driving unit for driving a printing wire of a printer, in which the piezoelectric actuator element is used as a driving source.

The driving unit 20 includes an U-shaped body frame 22 formed of Invar alloy whose linear expansion coefficient is 2.0 ppm/°C. at a temperature ranging from room temperature to 100° C. A leaf spring 26 is provided at one of hand portions of the U-shaped body frame 22, and formed integrally with both of another leaf spring 27 provided in parallel with the leaf spring 26 and a slant-moving member 28 in an inverse U-shaped form. The leaf spring 27 is connected to a moving member 25. A longitudinal effect type of laminate piezoelectric actuator element 21 of this invention is mounted below the moving member 25, and a wedge-shaped pre-load member 32 of aluminum is provided below the piezoelectric actuator element 21 to provide the piezoelectric actuator element 21 with a pre-load and compensate for difference in expansion coefficient due to temperature change. The slant-moving member 28 is equipped with a slant-moving arm 30, and a printing wire 31 is provided to a pointed end of the slant-moving arm 30.

The moving member 25 is upwardly moved by expansion of the piezoelectric actuator element 21 with a piezoelectric or electrostrictive effect in the laminating or longitudinal direction. Upon displacement of the piezoelectric actuator element 21 in the longitudinal direction, both of the leaf springs 26 and 27 are deformed and then the slant-moving member 28 is counterclockwise slanted, and the slant-moving arm 30 is also counterclockwise slanted, so that the printing wire 31 is upwardly moved to thereby perform a printing operation.

As described above, the laminate piezoelectric actuator element of this invention has high reliability, and can be driven with a low driving voltage. Therefore, for example, when the laminate piezoelectric actuator element of this invention is used as a driving source of a impact type piezoelectric printer head, a driving voltage is remarkably decreased, and thus a power source is commonly used with a motor for driving other elements. As a result, miniaturization of a printer apparatus and decrease in cost can be performed.

Further, since the laminate piezoelectric actuator element has a piezoelectrically-inactive portion including no internal electrode layer at the peripheral portion thereof, and thus reliability of insulation between internal electrode layers is high, and resistance against humidity is excellent.

Still further, the laminate piezoelectric actuator element of this invention is designed so that the area of the adhesive member for attaching the neighboring piezoelectric subunits therethrough is equal or smaller than the area of the internal electrode to form a slit portion at the peripheral portion of the adhesive member, and a restrictive action of the piezoelectrically-inactive portion on the displacing motion of the piezoelectric actuator element is depressed. As a result, displacement damage, inhomogeneous displacement distribution and internal stress of the piezoelectric actuator element is depressed, and thus the piezoelectric actuator element is protected from being broken down.

Still further, the piezoelectric actuator element of this invention is filled with a filler into the slit portions, so that the mechanical strength thereof is not prevented from being depressed due to the presence of the slit portions.

What is claimed is:

1. A laminate piezoelectric actuator element for generating a longitudinal electrostrictive strain through a piezoelectric/electrostrictive longitudinal effect with a voltage, comprising:

plural laminated piezoelectric subunits each comprising piezoelectric ceramic layers for generating the longitudinal electrostrictive strain therethrough with an applied voltage thereto, internal electrode layers each comprising an internal electrode and a drawing electrode for applying the voltage to said piezoelectric ceramic layers, and piezoelectrically-inactive portions for generating no longitudinal electrostrictive strain, said piezoelectric ceramic layers and said internal electrode layers being alternatingly laminated on each other, and said internal electrodes having an area smaller than an area of said piezoelectric ceramic layers to define said piezoelectrically-inactive portions as parts of said piezoelectric ceramic layer having no internal electrodes laminated thereon;

an adhesive member for attaching said laminated piezoelectric subunits to one another therethrough, an attaching area of said adhesive member being equal to or smaller than the area of said internal electrodes to thereby form slit portions between said laminated piezoelectric subunits in such a manner as to surround said adhesive member, wherein said plural piezoelectric element subunits are laminated through the adhesive member in a laminating direction thereof; and external electrodes provided at both sides of said piezoelectric subunits in such a manner as to be connected to said internal electrode through said drawing electrode to apply the voltage to said internal electrode.

2. A laminate piezoelectric actuator element as claimed in claim 1, wherein said adhesive member comprises any material selected from the group consisting of thermosetting organic adhesive, engineering plastic, soldering agent, low-melting glass and piezoelectric ceramic material having a lower sintering temperature than a sintering temperature of said piezoelectric ceramic layers.

3. A laminate piezoelectric actuator element as claimed in claim 2, wherein said low-melting glass has a thickness below 15 microns.

4. A laminate piezoelectric actuator element as claimed in claim 2, wherein said piezoelectric ceramic material has a sintering temperature lower than a sintering temperature of said piezoelectric ceramic layers.

5. A laminate piezoelectric actuator element as claimed in claim 1, further comprising a filler having a smaller Young's modulus than a Young's modulus of said piezoelectric ceramic layers, said filler being filled in said slit portions.

6. A laminate piezoelectric actuator element as claimed in claim 5, wherein said filler comprises thermosetting resin of epoxy group.

7. A laminate piezoelectric actuator element as claimed in claim 1, wherein said piezoelectric ceramic layers is formed of lead zirconate titanate.

* * * * *